United States Patent [19]

Nix et al.

[11] Patent Number: 4,945,240
[45] Date of Patent: Jul. 31, 1990

[54] THERMAL IMAGING DEVICE

[75] Inventors: Elvin L. Nix, Windsor; Stanley Taylor, Sunbury-on-Thames, both of England

[73] Assignee: Thorn EMI plc, London, England

[21] Appl. No.: 359,880

[22] Filed: Jun. 1, 1989

[30] Foreign Application Priority Data

Jun. 1, 1988 [GB] United Kingdom ............... 8812955

[51] Int. Cl.[5] ................ H01L 27/146; H01L 31/09
[52] U.S. Cl. ................................ 250/330; 250/332; 250/338.3
[58] Field of Search ............... 250/380, 332, 338.3, 250/349

[56] References Cited

U.S. PATENT DOCUMENTS

| 4,072,863 | 2/1978 | Roundy | 250/332 |
| 4,532,424 | 7/1985 | Cheung | 250/338.3 |
| 4,593,456 | 6/1986 | Cheung | 437/3 |
| 4,740,700 | 4/1988 | Shaham et al. | 250/332 |
| 4,808,822 | 2/1989 | Manning et al. | 250/332 |
| 4,847,500 | 7/1989 | Pedder et al. | 250/338.3 |

FOREIGN PATENT DOCUMENTS 2163596 2/1986 United Kingdom .

Primary Examiner—Constantine Hannaher
Assistant Examiner—Edward J. Glick
Attorney, Agent, or Firm—Fleit, Jacobson, Cohn, Price, Holman & Stern

[57] ABSTRACT

A pyroelectric film has a pattern of inter-connected electrodes formed on one major surface, and a pattern of discrete electrodes formed on the other major surface. Each discrete electrode has an aperature in which is formed a respective electrically conductive pad. The film is supported by pillars connected to the pads, the pillars also providing a path for electrical signals between the pads and a signal processing means. Each discrete electrode is connected to a respective pad by a respective strip of electrically conductive material.

10 Claims, 3 Drawing Sheets

THERMAL IMAGING DEVICE

This invention relates to thermal imaging devices and in particular to thermal imaging devices comprising an array of pyroelectric detector elements responsive to infra-red radiation.

BACKGROUND OF THE INVENTION

The main factor limiting the performance of existing pyroelectric imagers is the thermal conductance between adjacent detector elements and between each detector element and the supporting and interrogating structure.

U.K. Patent Application No. 2163596A discloses a thermal imaging device comprising a ferroelectric slab bearing a common electrode on one main surface and a signal electrode structure on the opposite main surface. The signal electrode structure is electrically connected to electrodes of a circuit substrate by means of conductors. The transverse heat conduction between adjacent conductors is reduced by incorporating each conductor on a bore in a respective pillar of thermally insulating material, the pillars also being effective to support the ferroelectric slab.

SUMMARY OF THE INVENTION

It is an object of the present invention to provide an alternative thermal imaging device in which the pyroelectric detector elements are supported by pillars, but wherein the thermal losses between the detector elements and supporting pillars are reduced.

According to a first aspect of the present invention a thermal imaging device comprises: a layer comprising pyroelectric material; an array of inter-connected electrodes carried on one major surface of the layer; an array of discrete electrodes carried on the other major surface of the layer; a plurality of pillars effective to support the layer and to enable the passage of electrical signals between the discrete electrodes and an electrical signal processing means, each pillar being located on an electrical contact region within a nonelectroded region of said other major surface within a respective discrete electrode, the contact region and discrete electrode being electrically connected by a respective elongate region of electrically conductive material extending over said nonelectroded region.

The layer may comprise a continuous film of pyroelectric material, for example, a pyroelectric polymer.

Alternatively the layer may comprise an array of discrete regions of pyroelectric material carried on a continuous film of dielectric material. Examples of suitable pyroelectric materials are lead lanthanum zirconium titanate, lead zirconium titanate, lead titanate and barium titanate.

The pyroelectric material suitably comprises polyvinylidene fluoride (PVDF) or a copolymer of vinylidene fluoride with, for example, trifluoroethylene (P(VDF-TrFE)).

The pyroelectric material in the device may comprise material which is inherently pyroelectric, or material whose pyroelectric characteristics are induced (e.g. by appropriate poling of ferroelectric material).

The elongate region suitably has a length to width ratio of at least 5.

In a preferred embodiment, said array of inter-connected electrodes comprises an array of electrically conductive regions carried on said one surface at positions corresponding to the positions of the discrete electrodes on the other surface, said electrically conductive regions being inter-connected by electrical conductors which are narrow compared with the width of the electrically conductive regions.

According to a second aspect of the present invention a process for making a thermal imaging device comprises: forming a layer comprising pyroelectric material; forming an array of discrete electrodes on one major surface of the layer, each discrete electrode substantially surrounding a nonelectroded portion of the one surface; forming electrically conductive contact regions within the nonelectroded regions together with an elongate region of electrically conductive material extending over the nonelectroded region and electrically connecting each discrete electrode to a respective contact region; forming respective electrically conductive support pillars on each contact region; connecting the support pillars to the input terminals of a signal processing means; and forming an inter-connected electrode structure on the other major surface of the layer, at positions aligned with the array of discrete electrodes.

Where the layer is a pyroelectric polymer, the step of forming a layer suitably comprises: spin-coating a layer of a polymer on an electrically conductive substrate; treating the polymer such that it is made pyroelectric; and dissolving away the substrate before forming the inter-connected electrode structure on the other major surface of the layer.

Where the layer comprises an array of discrete regions of pyroelectric material carried on a continuous film of dielectric material, the inter-connected electrode structure is formed on one surface of the dielectric material; and the step of forming a layer comprises: forming an array of regions of pyroelectric material on the inter-connected electrodes and exposed regions of the one surface of the dielectric film.

The optimum thickness of pyroelectric materials in hybrid structures of low thermal conductance is of the order of one micron. The thermal conductance of metal electrodes dominates that of a pyroelectric material one micron thick even if the metal film is only 0.03 micron, the thickness below which gold films become discontinuous. The use of a long, narrow electrical conductor to connect each pillar and discrete electrode ensures that the thermal conductance from the respective pixel to the support pillar is small.

Two thermal imaging devices in accordance with invention together with methods for fabricating the devices, will now be described, by way of example only, with reference to the accompanying drawings of which:

PREFERRED EMBODIMENT OF THE INVENTION

Figure 1:
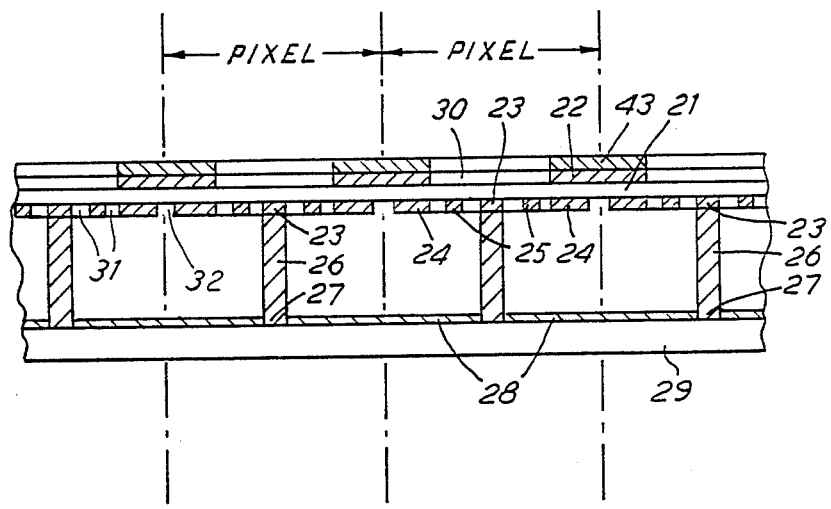
FIG. 1 shows a section of the first thermal imaging device.
Figure 2A:
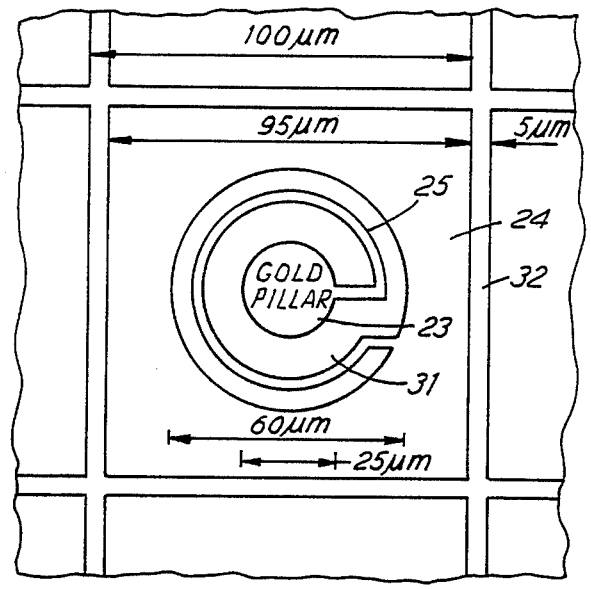
FIG. 2(a) is a schematic sectional view of part of a surface of the device of FIG. 1 illustrating the discrete electrodes.
Figure 2B:
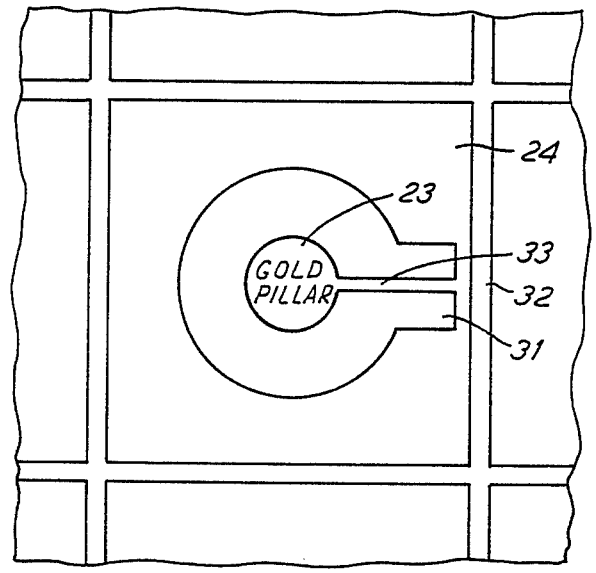
FIG. 2(b) is a schematic sectional view corresponding to FIG. 2(a) illustrating a modified arrangement.

Referring firstly to FIGS. 1 and 2(a), a pyroelectric film 21 of, for example, P(VDF-TrFE) has a pattern of inter-connected electrodes 22 formed on one side and an array of discrete electrodes 24 on the other side. Electrically conductive pads 23 are connected by respective narrow electrically conducting strip 25 which passes almost completely round the pad 23 to the surrounding discrete electrodes 24. Pillars 26 are attached at one end to pads 23 and at the other end to input pads 27 of an integrated circuit 28 formed on the substrate 29. Thus thermal insulation is provided by the gap 31 between each pad 23 and surrounding discrete electrode 24. A gap 32 separates adjacent pixels. FIG. 2(b) shows an alternative arrangement of the structure carried on the second side of the film 21. This again comprises a pad 23, a gap 31 around the pad and a discrete electrode 24. The electrode 24 is however linked to the pad 23 by a narrow electrically conductive linear strip 33 which extends almost to the edge of the discrete electrode 24.

Figure 3:
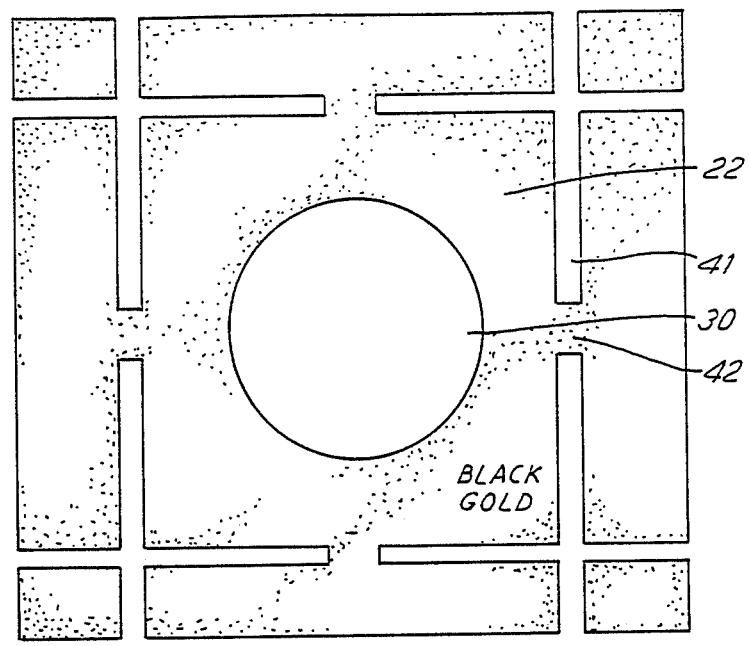
FIG. 3 shows a plan view of the device illustrating the inter-connected electrode arrangement.

FIG. 3 shows a plan view of the inter-connected electrodes shown at 22 in FIG. 1. The inter-connected electrodes each have a central hole 30 in the area corresponding to the pads 23 and to the gap 31 within the discrete electrodes 24 shown in FIGS. 2(a) or 2(b). The central hole 30 ensures that the inter-connected electrodes do not increase the thermal conductance between the pads 23 and discrete electrodes 24. Furthermore, the thermal conductance from pixel to pixel is kept low by the use of a thin pyroelectric film and by the gap 41 between adjacent pixel areas of the inter-connected electrodes, electrical continuity being provided by narrow conducting strips 42 across the gaps 41. The inter-connected electrodes will generally be covered by an infra-red absorbent layer 43 (shown in FIG. 1), for example a layer of black gold, platinum black, or a metal-dielectric-metal sandwich structure. Alternatively, if the discrete electrode-pyroelectric film-inter-connected electrode layers together comprise a ¼ wavelength thickness for infra-red radiation (i.e. about 1.5 microns) this structure itself will constitute an efficient thermal absorber.

Figure 4:
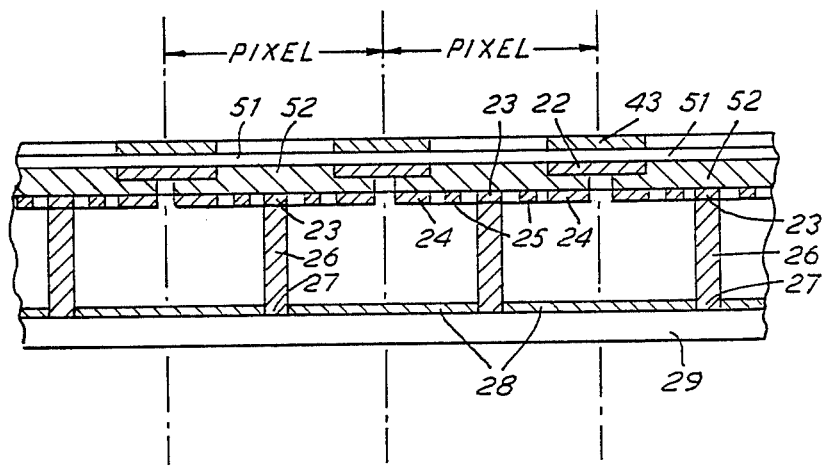
FIG. 4 shows a section of the second thermal imaging device.

The second device to be described is shown in FIG. 4, in which corresponding features of those of the first device are correspondingly labelled. A dielectric film 51 has a pattern of inter-connected electrodes 22 formed on a surface. An array of discrete pyroelectric regions 52 is formed on the electrodes 22 and the dielectric film 51 where exposed and an array of discrete electrodes formed on the pyroelectric elements. The inter-connected electrodes 22 and the discrete electrodes 24 surrounding a central conductive pad and conducting strips 25 are similar to those described hereinbefore with reference to FIGS. 3 and 2 respectively. The arrangement of the pillars 26, integrated circuits 28, substrate 29 and infra-red absorbant layer 43 is similar to that described hereinbefore with reference to FIG. 1.

The pyroelectric regions may be again formed, for example, from a pyroelectric polymer, or may, for example, be formed from a ferroelectric ceramic material.

Two processes for making a thermal imaging device, the first relevant to the device shown in FIG. 1, and the second relevant to the device shown in FIG. 4, will now be described. In the first process it is assumed that the pyroelectric film 21 is a copolymer of polyvinylidene fluoride (PVDF), but any thin self-supporting pyroelectric material could be employed. In the first process an optically flat electrically conductive substrate is spin-coated with polyvinylidene fluoride-trifluoroethylene copolymer (VDF-TrFE). The substrate might be a silicon wafer, or any material which can be etched or dissolved away in a subsequent process The VDF-TrFE copolymer may be dissolved in a mixture of acetone and dimethyl formamide, or in one or more of several possible solvents for VDF copolymers. The spin-coated polymer layer is chosen to be an optimum thickness for the infra-red detection application, and will be typically 1 micron thick.

The polymer membrane is made pyroelectric by any standard technique such as by corona poling.

A gold pattern of discrete electrodes 24, pads 23 and strips 25 such as those shown in FIG. 2a is then formed on the pyroelectric film 21 by standard photolithographic techniques. This will be referred to as the bottom electrode. The pattern repeat distance is typically 100 microns and the gold thickness 0.03 microns. Each element of the pattern will be referred to as a pixel, with a typical array having at least 100×100 pixels. The strips 25 will typically be 3 microns wide.

The gap region 31 of the electrode (60 microns in external diameter), around the centre region provides the thermal isolation between the centre region 23 and the active thermal detection region 21 of each pixel.

Gold support pillars—typically 25 microns diameter and 25 microns high—are grown by standard photolithographic and electroplating techniques on the input pads 27 of an integrated circuit 28. FIGS. 1 and 2a show the position where the pillars connect to the discrete electrode pattern.

The whole device is then inverted on to a complementary electronic measurement circuit on a silicon chip 29, and electrical connection made to the gold pillars, for example by soft solder.

The original substrate material is etched or dissolved to leave the polymer layer supported by the gold pillars.

The inter-connected electrodes are formed by standard photolithographic techniques on the exposed side of the pyroelectric film 21. The inter-connected electrode pattern registers with the discrete electrodes so that the central regions of pyroelectric film 21 are left unelectroded. These regions provide the thermal isolation between the pillars and the active, electroded, outer region of each pixel.

An additional infra-red absorbing layer may also be deposited in the same pattern and position as the inter-connected electrode structure. The thermal mass of the inter-connected electrodes and absorbing layer will, in general, be greater than that of the discrete electrodes but this extra material will not increase the conductance between detector and silicon chip.

In the second process for making a thermal imaging device in accordance with FIG. 4 a pattern of inter-connected electrodes is formed by standard photolithographic techniques on a thin film of a dielectric (for example polyimide, silicon oxide, silicon nitride or silicon oxy-nitride). This inter-connected electrode pattern is of the form illustrated in FIG. 3 and carries an infra-red absorbing material, such as black gold.

The inter-connected electrode pattern is spin-coated with polyvinylidene fluoride-trifluoroethylene copolymer (P(VDF-TrFE)), which might be dissolved in a mixture of acetone and dimethyl formamide, or in one or more of several possible solvents for VDF copolymers. The spin-coated polymer layer is chosen to be an optimum thickness for the infra-red detection application, and will be typically 1 micron thick and is formed as an array of discrete elements of the copolymer as shown in FIG. 4.

The polymer membrane or elements are made pyroelectric by any standard technique such as by corona poling.

A gold pattern of discrete electrodes, pads, and interconnecting strip such as the one shown in FIG. 2a is then formed on the pyroelectric elements by standard photolithographic techniques. The pattern repeat distance is typically 100 microns and the gold thickness 0.03 microns. Each element of the pattern will be referred to as a pixel, and a typical array has at least 100×100 pixels.

A gold track typically 3 microns wide, connects each pad 23 to the discrete electrode 24. The gap region 31 of the electrode (60 microns in external diameter) around the centre region provides the thermal isolation between the centre region 23 and the active thermal detection region 24 of each pixel.

Gold support pillars—typically 25 microns diameter and 25 microns high—are grown by standard photolithographic and electroplating techniques on the input pads of an integrated circuit.

The whole device is then inverted on to the complementary electronic measurement circuit on a silicon chip 29, and electrical connection made to the gold pillars, for example by soft solder.

The embodiments described hereinbefore are given by way of example only to illustrate how advantage can be taken of the low thermal conductance both between adjacent detector elements, resulting from the use of gaps between the interconnected electrodes and the use of thin pyroelectric films (with or without thin dielectric films), and also between elements and the supportive pillars, resulting from the use of gaps between the pads and discrete electrodes and the use of central holes in the inter-connected electrodes.

We claim:

1. A thermal imaging device comprising: a layer comprising pyroelectric material; an array of inter-connected electrodes carried on one major surface of the layer; an array of discrete electrodes carried on the other major surface of the layer; a plurality of pillars effective to support the layer and to enable the passage of electrical signals between the discrete electrodes and an electrical signal processing means, each pillar being located on an electrical contact region within a nonelectroded region of said other major surface within a respective discrete electrode, the contact region and discrete electrode being electrically connected by a respective elongate region of electrically conductive material extending over said nonelectroded region.

2. A device according to claim 1 in which the layer comprises a continuous layer of pyroelectric material.

3. A device according to claim 1 in which the layer comprises an array of discrete regions of pyroelectric material carried on a continuous film of dielectric material.

4. A device according to claim 1 in which said array of inter-connected electrodes comprises an array of electrically conductive regions carried on said one surface at positions corresponding to the positions of the discrete electrodes on the other surface, said electrically conductive regions being inter-connected by electrical conductors which are narrow compared with the width of the electrically conductive regions.

5. A device according to claim 1 in which the pyroelectric material is a pyroelectric polymer.

6. A device according to claim 5 in which the pyroelectric material comprises polyvinylidene fluoride (PVDF) or a copolymer of vinylidene fluoride with, for example, trifluoroethylene (P(VDF-TrFE)).

7. A device according to claim 1 in which the pillars are metallic pillars.

8. A process for making a thermal imaging device comprising: forming a layer comprising pyroelectric material; forming an array of discrete electrodes on one major surface of the layer, each discrete electrode substantially surrounding a nonelectroded portion of the one surface; forming electrically conductive contact regions within the nonelectroded regions together with an elongate region of electrically conductive material extending over the nonelectroded region and electrically connecting each discrete electrode to a respective contact region; forming respective electrically conductive support pillars on each contact region; connecting the support pillars to the input terminals of a signal processing means; and forming an inter-connected electrode structure on the other major surface of the layer, at positions aligned with the array of discrete electrodes.

9. A process according to claim 8 in which the layer is a pyroelectric polymer, and the step of forming a layer comprises: spin-coating a layer of a polymer on an electrically conductive substrate; treating the polymer such that it is made pyroelectric; and dissolving away the substrate before forming the inter-connected electrode structure on the other major surface of the layer.

10. A process according to claim 8 in which the layer comprises an array of discrete regions of pyroelectric material carried on a continuous film of dielectric material, the inter-connected electrode structure is formed on one surface of the dielectric material; and the step of forming a layer comprises: forming an array of regions of pyroelectric material on the inter-connected electrodes and exposed regions of the one surface of the dielectric film.

* * * * *